United States Patent [19]
Pennington

[11] Patent Number: 5,866,986
[45] Date of Patent: Feb. 2, 1999

[54] MICROWAVE GAS PHASE PLASMA SOURCE

[75] Inventor: Michael A. Pennington, Cary, N.C.

[73] Assignee: Integrated Electronic Innovations, Inc., Cary, N.C.

[21] Appl. No.: 695,147

[22] Filed: Aug. 5, 1996

[51] Int. Cl.⁶ ................................................. H01J 37/32
[52] U.S. Cl. ..................................... 315/111.21; 156/345
[58] Field of Search ................... 315/111.21; 156/345 P, 156/345 MW

[56] References Cited

U.S. PATENT DOCUMENTS

| | | | |
|---|---|---|---|
| 4,939,424 | 7/1990 | Kieser et al. | 315/111.21 |
| 5,047,115 | 9/1991 | Charlet et al. | 156/345 MW X |
| 5,499,754 | 3/1996 | Bobbio et al. | 156/345 MW X |
| 5,647,944 | 7/1997 | Tsubaki et al. | 156/345 MW |

FOREIGN PATENT DOCUMENTS

| | | | |
|---|---|---|---|
| 0284436 | 9/1988 | European Pat. Off. | 315/111.21 |
| 3-238800 | 10/1991 | Japan | 315/111.21 |
| 4-225226 | 8/1992 | Japan | 315/111.21 |

*Primary Examiner*—Robert Pascal
*Assistant Examiner*—Justin P. Bettendorf
*Attorney, Agent, or Firm*—Lynn E. Barber

[57] ABSTRACT

A plasma generator assembly for treatment of an item to be soldered in a vacuum chamber. The generator includes a chamber having a first opening for placement of a microwave source, formed so that plasma generated from a gas is spread out over a wide area; a second chamber for containing generated plasma effluent; and a partial barrier such as a perforated plate and/or an optical baffle attached to the second chamber. On the opposite side of the partial barrier from the second chamber is the area of the vacuum chamber for treatment of the item.

18 Claims, 3 Drawing Sheets

MICROWAVE GAS PHASE PLASMA SOURCE

BACKGROUND OF THE INVENTION

1. Field of the Invention

This invention relates to plasma generation, and in particular, relates to a method of plasma generation utilizing microwave energy.

2. Description of the Related Art

Plasma generation, the generation of glow-discharge (a gas consisting of a stream of high velocity ions, electrons and neutral particles), is used to treat areas to be soldered in plasma-assisted dry soldering (PADS). See for example, U.S. Pat. No. 4,921,157 on a fluxless soldering process. Generation of plasma with microwaves is now done utilizing a low-pressure, rarified gas and generating plasma only in a small area. For example, a quartz insulator having dimensions of about 3–4 inches on a side is used to generate plasma with a small aperture of about 2 inches. In one type of plasma generation, using $SF_6$ as a source gas, atomic fluorine F, is readily formed. It is a free radical and therefore has a short lifetime. Because there is only a small area of treatment which may be remote from some of the areas to be treated with the plasma, some areas may not be treated because the F does not survive until it reaches that treatment area. Thus, in the prior method, only a small portion of the active species, for example, F, actually gets to the treatment site. By the time the F reaches the treatment site, it has generally recombined with other radicals which have diffused out of the plasma region, often with about a 100-fold decrease in effectiveness at the outer regions of, for example, a 12-cm treatment area.

Plasma may also be generated with electron cyclotron resonance systems (ECR), inductively coupled (or capacitively coupled) radio frequency (RF) plasma, DC-coupled plasma systems and helicon waves (waves of plasma formed in a magnetic field which interact with the field in such a way as to heat the plasma). In addition, the AFTERFLOW™ hollow quartz tube (Machine Technologies, Inc., Parsippany, N.J.) within a microwave guide assembly may be used to generate plasma in a confined area.

It is therefore an object of this invention to provide a method and apparatus which allow plasma generation over an expanded area, for use, for example, in treatment with short-lived species, such as in plasma-assisted dry soldering.

Other objects and advantages will be more fully apparent from the following disclosure and appended claims.

SUMMARY OF THE INVENTION

The invention herein is for a plasma generator for treatment of an item to be soldered. The generator assembly comprises in its broadest aspect a first chamber, having a first opening for placement of a microwave source, and having a second opening opposite the first opening; a second chamber for containing generated plasma and having a third opening opposite a fourth opening, so that the third opening is mated with the second opening; and preferably a partial barrier at the fourth opening. The first chamber can be funnel-shaped and/or contain reflectors placed in suitable orientation to the microwave source so that microwaves are directed towards the second and third openings. An insulator, which is transparent to microwaves, is positioned across the aligned second and third openings. The second chamber is positioned on the opposite side of the insulator from the first chamber. The barrier is preferably a perforated plate, preferably aluminum, which is preferably positioned at the fourth opening. On the opposite side of the perforated plate from the second chamber is a vacuum chamber in which the item(s) to be treated with the plasma may be positioned. Because the plasma source of this invention is efficient and intense, it may be necessary to use an optically dense baffle in lieu of, or in addition to, the perforated aluminum plate. Both the plate and baffle may be cooled by some external means, for example, by thermal connection to a flowing water source.

When using the invention on highly electro-negative gases, such as $SF_6$, additions of other gases to the rarified gas enable more efficient plasma generation. Some of these can be argon, helium, neon, xenon, and other reactive and non-reactive mixtures. It has been shown that mixing argon with the $SF_6$ in the range of 10–90% significantly increases (2×) the activity of the downstream effluent (radical species). Visual observations of the plasma glow also indicate that mixing gas changes the appearance of the glow.

The method of the invention for generating plasma comprises providing a plasma generator according to the invention; connecting a microwave source, for example, a magnetron tube, to the first opening; placing an item to be soldered in the vacuum chamber on the opposite side of the plate and/or baffle from the second chamber; flowing a suitable plasma source gas (e.g., $SF_6$) or source gas mixture (e.g., $SF_6/Ar$) at an appropriate pressure in the second chamber; and turning on the microwave source to generate plasma for treatment of the item.

Other aspects and features of the invention will be more fully apparent from the following disclosure and appended claims.

DETAILED DESCRIPTION OF THE INVENTION AND PREFERRED EMBODIMENTS THEREOF

Figure 1:
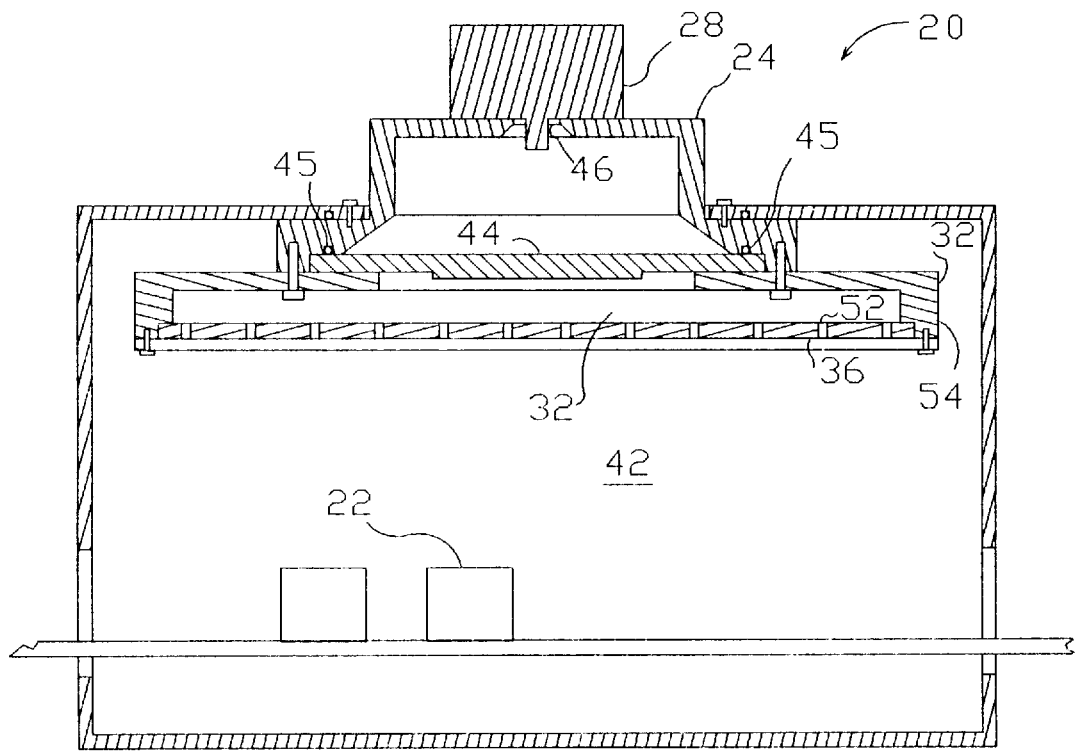
FIG. 1 is a schematic view of the plasma generator assembly of a first embodiment of the invention having a funnel-shaped first chamber, and an optional perforated plate.

The present invention (FIGS. 1–2 and 7) provides a plasma generator assembly 20 for treatment of an item 22 to be soldered in an evacuated space. The generator assembly 20 comprises in its broadest aspect a first chamber 24, having a first opening 26 for placement of a microwave source 28, having a second opening 30 (FIG. 7) on the opposite side of the first chamber 24 from the first opening 26, and having a structure which enables spreading out of microwaves from the microwave source 28. The preferred orientation of the microwave source 28 in the invention is aimed directly into the first chamber 24 with the microwaves coming out from the sides of the microwave source 28 and toward the sides of the first chamber 24, and not directly toward the area where treatment is to occur, in contrast to prior uses of a microwave source.

A second (plasma) chamber 32 (FIGS. 1, 2 and 7) is connected to the first chamber 24 and has a third opening 34 which is aligned with, and sealingly connected to, the second opening 30 in the first chamber 24, for containing a low-pressure rarified gas and plasma generated from the gas. Preferably a partial barrier, which may be a perforated plate 36 (FIG. 1) and/or an optical baffle 38(FIG. 2), is placed at a fourth opening 40 in the second chamber 32 located opposite the third opening 34. A vacuum (treatment) chamber 42 preferably encloses part or all of the first and second chambers 24, 32, but is imperviously separated from them by their walls and vacuum seals, such as one or more O-rings, except for the partial barrier between the second chamber 32 and vacuum chamber 42. Generated plasma effluent (glow-discharge), but not the plasma itself, can pass through the perforated plate 36 and/or optical baffle 38, if present, from the low-pressure second chamber 32 into the low-pressure space of the vacuum (treatment) chamber 42 where items 22 to be treated may be positioned.

Figure 2:
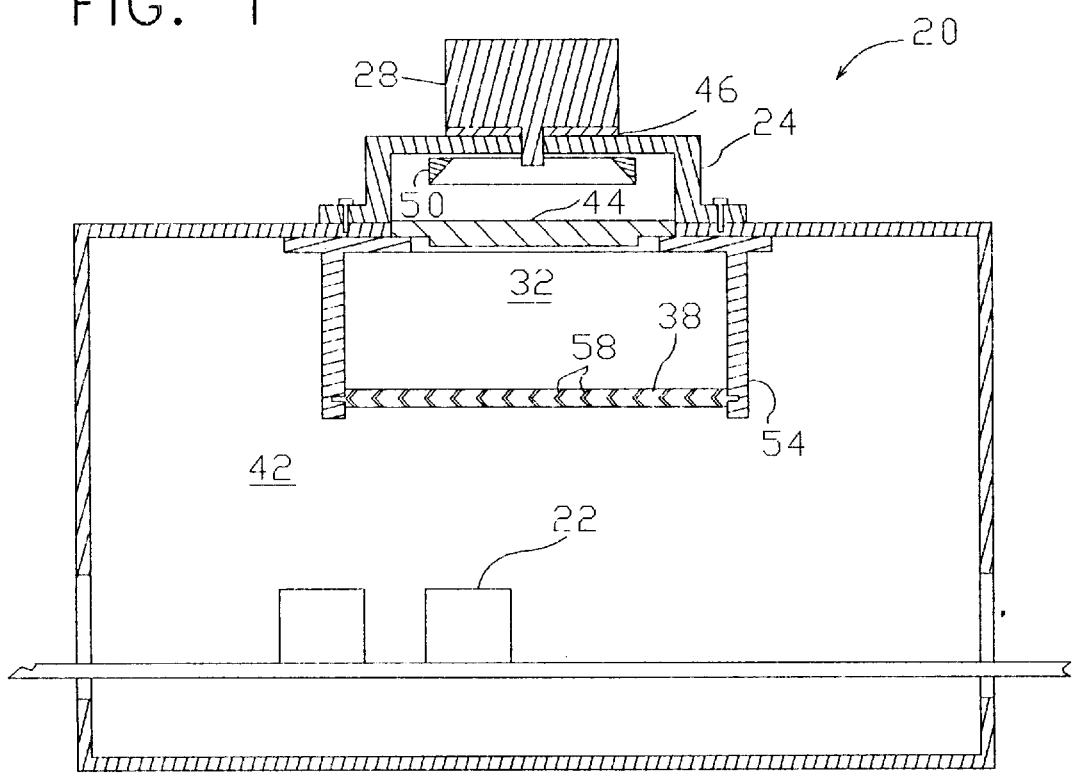
FIG. 2 is a schematic view of the plasma generator assembly of a second embodiment of the invention having a cylindrical first chamber with suitable microwave reflectors, and having an optional optical and cooling baffle.
Figure 7:
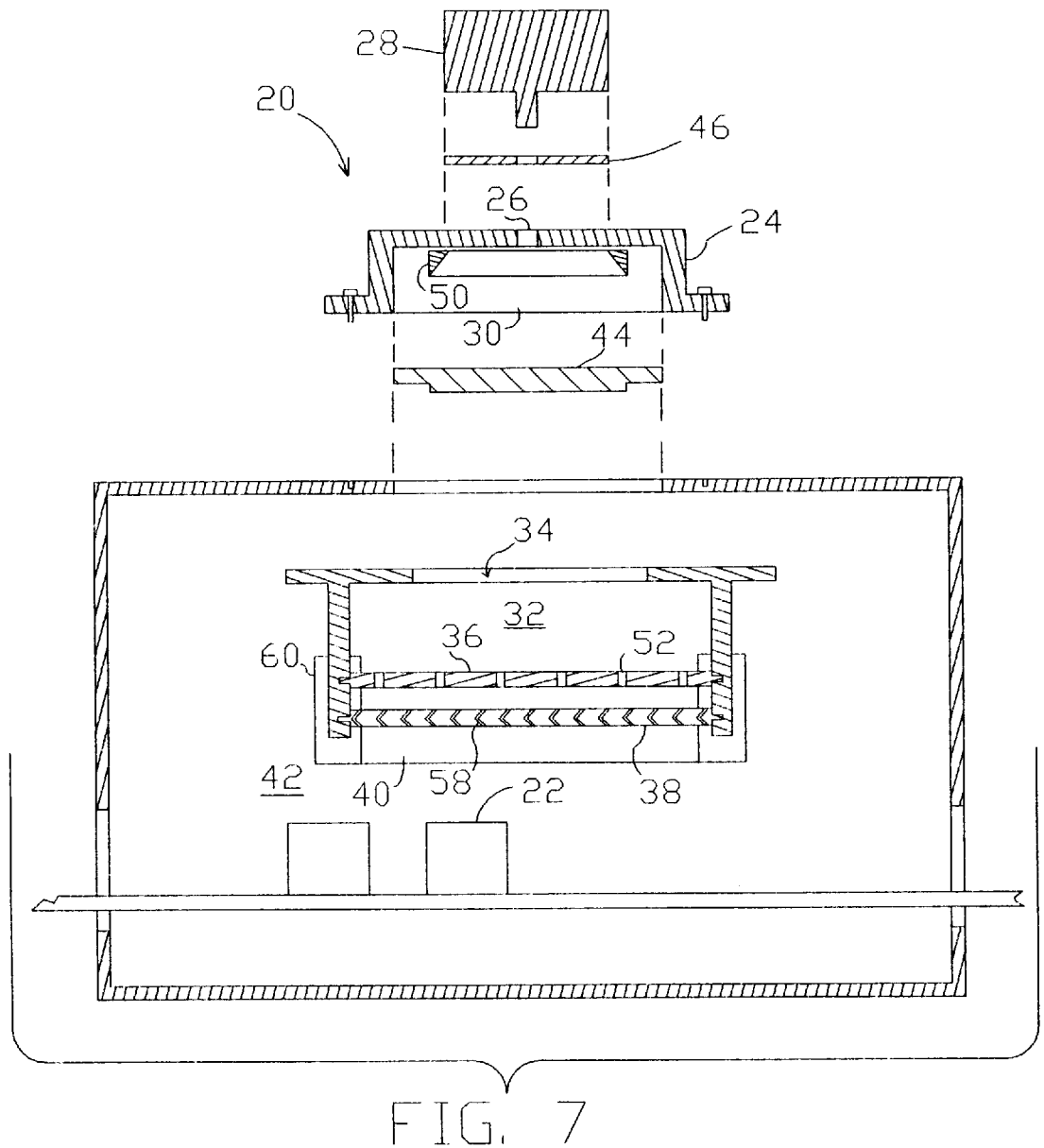
FIG. 7 is an expanded, schematic view of the chambers of the invention, and shows use of a cylindrical first chamber with microwave reflectors, and of both a perforated plate and an optical and cooling baffle.

The entire generator assembly 20 of the invention may be oriented in any direction that is suitable for treatment of the selected items 22 which are to be treated. The most straightforward orientation is to have the microwave source 28 at either the top of the assembly, as shown in FIGS. 1, 2, and 7, or inverted so that the microwave source 28 is at the bottom of the assembly and the items 22 to be treated are placed above the second chamber 32. Alternatively, the entire generator assembly 20 of the invention may be oriented so that the microwave source 28 is at the side of the assembly. There also may be more than one generator assembly 20, positioned either so that the plasma from each assembly is directed at a different side of the item(s) 22 to be treated or into a channel or open area where the items are positioned, or arranged in a series for sequential treatment.

Preferably, the first chamber 24 is funnel-shaped (conical) so that the second opening 30 is larger than the first opening 26 as shown in FIG. 1. The preferred funnel shape of the first chamber 24 allows microwaves to reach a larger surface than the area of the first opening 26 so that there is microwave energy directed across the wider area of the second opening. Without the funnel shape which spreads out the plasma shape, the shape of the generated plasma is essentially spherical rather than conical. For a circular wave guide, the cavity in chamber 24 should be sized so that it acts as a wave guide, preferably about at least ¼ of a wave in a circular wave guide. Essentially any length could be used depending on the frequency of radiation, so long as the plate (insulator 44) does not act as a grounded piece of metal with respect to the wave.

In a second embodiment of the invention, the first chamber 24 is a cylindrical cavity as shown in cross-section in FIG. 2. Attached to the first chamber 24 (both electrically and mechanically), particularly useful when the first chamber 24 is not funnel-shaped, is a microwave reflector 50. This reflector 50 may be a beveled annulus as shown or simply a set of discreet beveled surfaces placed with the beveled surfaces oriented toward the microwave source as shown. The angle of the bevel should be approximately 45° and radial location of the beveled surface may vary, but is preferably at $\lambda/4$ away from the center line of the microwave source 28 ($\lambda$ is the microwave wavelength).

In addition to the beveled microwave reflector 50, any structure of the chamber which effectively distributes the microwaves over the second opening 30 may be used in the invention.

Figure 5:
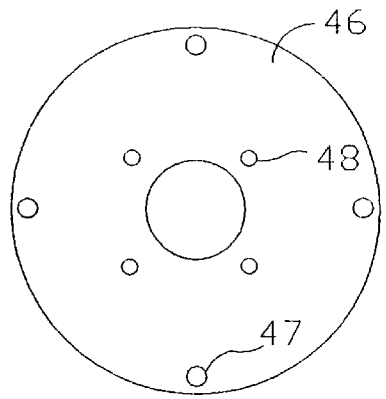
FIG. 5 is a top plan view of the attachment plate.
Figure 6:
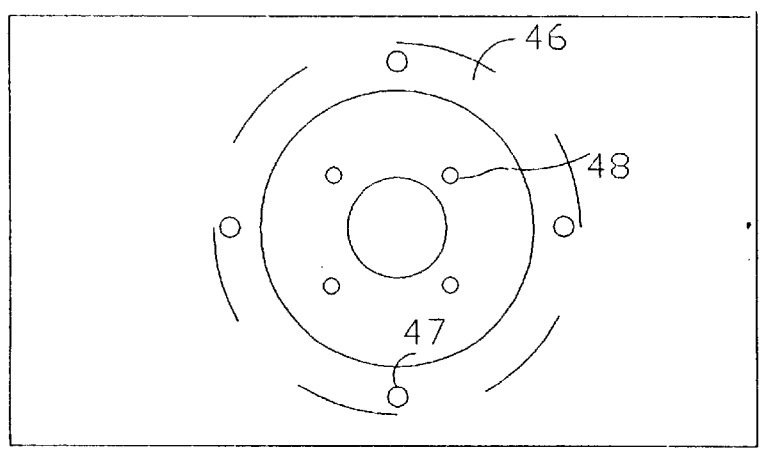
FIG. 6 is a top plan view of the first opening.

In the preferred embodiments of the invention, an attachment plate 46 is firmly fixed to the first opening, such as by bolting through holes 47 in the wall around the opening 26 in the first chamber 24 and corresponding holes 48 in the attachment plate 46 (FIGS. 5–6).

As shown in FIG. 1, in the preferred embodiment, a magnetron tube or other microwave source 28 is sealed with a microwave seal to the attachment plate 46 at the first opening 26 of the first chamber 24. The magnetron tube can be remotely placed and a wave guide, as is known in the art, can be used to bring the microwaves to the first opening 26. As an alternative to the magnetron, a klystron tube (triode) (not shown) as is known in the art may be used as the source of radiation. The type and power of radiation source used depend on the needs of the user and the relevant requirements of the Federal Communications Commission.

An insulator 44 is preferably positioned across the second and third openings 30, 34, which are aligned with each other as shown in FIG. 7. Microwave energy may be introduced into the reduced pressure gas system by re-radiation of microwave radiation from the insulator 44 ("re-radiator") or by direct transmission through the insulator. A second type of re-radiator may be made of an electrically isolated conductor plate, placed in the path of the microwave radiation. The shape of the re-radiator can be optimized to provide optimal plasma conditions. The insulator, of a dielectric substance, is placed at the second opening 30 of the first chamber 24. The dielectric substance may be any nonconducting material that can sustain an electric field and serve as an insulator so that current is not conducted across the opening, such as quartz, glass, alumina ($Al_2O_3$) or other known insulating substances. This isolates the insulator so that it may vary in voltage with the microwave field.

An ideal insulator 44 with a dielectric constant of one would be fully transparent to the impinging microwaves, and would affect neither their amplitude or phase. A real insulator acts as a series impedance to the microwave radiation and may change both the amplitude and phase, depending on the relative amount of the resistive (absorbing) and reactive (phase changing) components of the material of which it is composed. If the two surfaces of the insulator 44 are generally coplanar as in FIGS. 1 and 2, the direction of the radiation is not much changed. On the other hand, if the two surfaces are curved relative to each other, the transmitted microwaves may be focused or defocused in a similar way to the action of a lens on visible light.

The insulator 44 is sealed, for example, with an O-ring seal 45 (FIG. 3) to both the first chamber 24 and the second chamber 32 so that there is a pressure difference across the entire insulator 44 Thus, the pressure within the first chamber 24 is preferably at about atmospheric pressure (about 760 torr) while the pressure inside the second chamber 32 is adjusted by evacuation and partial backfilling to be at a pressure suitable for establishing a glow discharge (generally about 10 millitorr to 50 torr). Thus, there is plasm formed in an area, corresponding to at least about the size of the fourth opening 40(FIG. 7), within the second chamber 32. Generally, it has been found that an insulator 44 at least about 3.2 inches in diameter, preferably about 8.0 inches, is sufficient for normal anticipated uses. The pressure difference across the insulator 44 provides an upper limit for the size of the insulator 44 as needed to prevent breakage of the insulator, but diameters as large as about 9 inches may be used without significant problem. Even larger insulators may be used, depending on the material of which they are made and their thickness, and the pressure differences across the insulator.

Figure 3:
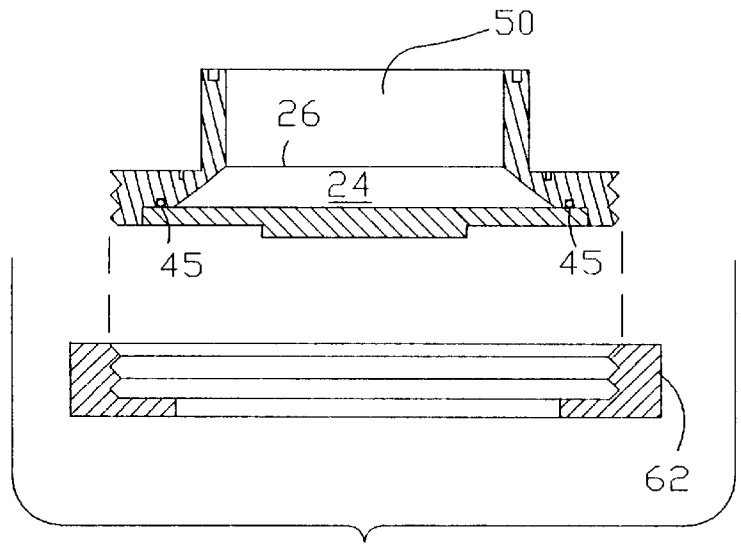
FIG. 3 is a partial schematic view of the first chamber of the first embodiment of the invention and the insulator.

It should also be noted that, as shown in FIG. 3, the lower circumference of the wall surrounding the first chamber 24 may be threaded so that it may be assembled with a matching thread on an insulator clamping plate 62.

The second chamber 32 (FIG. 7) is at essentially the same pressure as the evacuated environment around the item to be treated in the vacuum chamber 42, and contains the same low pressure gas due to the holes or openings in the partial barrier (see below) separating the second chamber 32 from the vacuum chamber 42.

Figure 4:
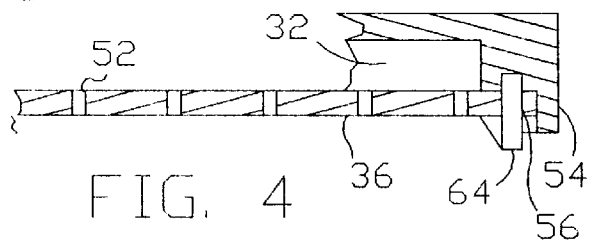
FIG. 4 is a partial cross-sectional side view of one side of the fourth opening of the second (plasma) chamber in which the aluminum plate is mounted.

Also in the preferred embodiment, the partial barrier is a perforated, preferably aluminum plate 36, which is positioned at the fourth opening 40 of the second (plasma) chamber 32. The rim area 54 of the second chamber 32 around the fourth opening 40 has a rabbet cut 56 in which the perforated plate 36 may be fit as shown in FIG. 4, the whole being assembled with clamping screws 64 as shown in FIG. 4.

The perforated plate 36 is preferably made of aluminum. The size of the fourth opening 40 and perforated plate 36 is chosen to be sufficient to treat with plasma the items positioned in a selected area opposite the plate. Thus, treatment in a 9-inch diameter circle has been found possible with a vacuum chamber 42 having dimensions in the area of treatment of about 14×16 inches, a perforated plate 36 of about 12×14 inches, and an insulator 44 having about a 9-inch diameter for soldering pretreatment.

A thickness of about ⅛ inch for the perforated plate 36 has been found to be satisfactory as well. Preliminary evidence indicates that a setback (thinner area of plate 36, not shown) which has been ground on the plasma side of the perforated plate may prove useful in shaping and controlling the distribution of plasma in the chamber.

Holes 52 in the perforated plate having a diameter of less than about ¼ inch, for example, about ⅛ inch, on ³⁄₁₆ inch centers across the entire surface of the perforated plate 36, have been found to be sufficiently big and numerous to allow enough of the downstream (effluent) plasma radical species to migrate through the holes 52 for treatment of an item 22 to be soldered, but not so large that there is undesirable plasma leakage from the second chamber 32 into the vacuum chamber 42.

In an alternate embodiment, an optical baffle 38 (FIG. 2) is used instead of a perforated plate 36. The optical baffle 38 of the invention is preferably a plurality of optically dense elongated angled pieces 58 extending across the fourth opening 40, essentially like the slats of venetian blinds. Optical baffle 38 may be mounted on its own frame in the rabbet cut 56 discussed above, instead of the perforated plate 36, or both the optical baffle 38 and the perforated plate 36 may be used with the optical baffle 38 preferably farther from the microwave source 28, and additional attachment means provided so that both the perforated plate 36 and the optical baffle 38 can be simultaneously used as shown in FIG. 7. The plasma effluent can get through optical baffled 38 between angled pieces 58 but not without first striking a cooled surface which thus cools the plasma effluent stream. Also, light cannot penetrate optical baffled 38. This is particularly useful for soldering parts which are sensitive to radiation or if there is a concern about thermal overheating. Preferably the pieces of baffled 38 are made of aluminum and are approximately one inch in width and of sufficient length to cover the plasma effluent aperture.

Both perforated plate 36 and optical baffle 38 are preferably cooled by an external cooling system 60, for example, with cooling channels of water or other coolant, or by being bolted to a large thermal mass, as is known in the art (shown schematically in FIG. 7).

The item 22 to be treated with the plasma treatment may be placed immediately beneath the perforated plate 36 and/or baffle 38, for example, about 1–2 inches from the chosen partial barrier or the nearest of the two partial barriers (generally the baffle 38 if both are used). The barrier size with respect to the item to be treated and the size of the item allows there to be active treatment across the whole surface area of the item. Once the microwave source 28 is turned on, if the second chamber 32 contains a rarified gas such as $SF_6$ as a source gas for the glow discharge, glow discharge occurs and plasma is formed. One or more gases such as argon, helium, neon, xenon, and other reactive and nonreactive mixtures of gases can also be added to the second chamber 32 to enable more efficient plasma generation.

The method of the invention for generating plasma, comprises providing a plasma generator assembly 20 according to the invention as discussed above (FIG. 7); positioning the microwave source 28, for example, a magnetron tube or waveguide coupled microwave energy, at the first opening 26, and placing an item 22 to be soldered on the opposite side of the perforated plate 36 and/or baffle 38 from the second chamber 32. Generation of plasma with the plasma generator assembly 20 of the invention requires evacuation of the vacuum chamber 42, which is then back-filled at a low pressure (for example, about 10 millitorr to 50 torr) with a gas such as $SF_6$. When the microwave source 28 is turned on, there is an avalanche of electrons generating ions and in a few microseconds, plasma has been generated for treatment of the selected item(s) 22.

While the invention has been described with reference to specific embodiments thereof, it will be appreciated that numerous variations, modifications, and embodiments are possible, and accordingly, all such variations, modifications, and embodiments are to be regarded as being within the spirit and scope of the invention.

What is claimed is:

1. A plasma generator for treatment of an item to be soldered, utilizing a vacuum chamber which has been evacuated and backfilled at a reduced pressure with a source gas or gas mixture, comprising:

(a) a first chamber, having a first opening for placement of a microwave source, having a second opening opposite the first opening, having an insulator across the second opening, and having a shape which enables spreading out of the microwaves from the microwave source;

(b) a second chamber for containing a reduced pressure source gas or gas mixture and plasma generated from the gas or gas mixture, said second chamber being at a pressure suitable for glow discharge, said second chamber having a third opening, with the first and second chambers being adjacently attached so that the third opening is aligned with the second opening, said second chamber having a fourth opening opposite the third opening; and (c) a partial barrier at the fourth opening through which a desired amount of generated radical species may pass from the second chamber into the vacuum chamber, wherein the first chamber contains a metallic reflector having a beveled surface oriented toward the microwave source.

2. The plasma generator assembly of claim 1, wherein the partial barrier comprises a perforated plate.

3. The plasma generator assembly of claim 2, wherein the perforated plate is made of aluminum.

4. The plasma generator assembly of claim 2, wherein the perforated plate has holes which are small enough to contain all of the plasma generated in the second chamber, but through which sufficient radical species pass to allow treatment of the item.

5. The plasma generator assembly of claim 2, wherein the perforated plate has holes which are less than about ¼ inch in diameter.

6. The plasma generator assembly of claim 1, wherein the partial barrier comprises an optical baffle comprising a plurality of optically dense elongated pieces extending across the fourth opening.

7. The plasma generator assembly of claim 1, wherein the first chamber is funnel-shaped.

8. The plasma generator assembly of claim 1, wherein mixtures of other gases are introduced into the second chamber, said gases being selected from the group consisting of argon, neon, krypton and xenon.

9. The plasma generator assembly of claim 1, wherein the source gas is $SF_6$.

10. The plasma generator assembly of claim 1, wherein the first chamber is cylindrical.

11. The plasma generator assembly of claim 1, further comprising a cooling system for the partial barrier.

12. A plasma generator assembly, comprising:
    (a) a funnel-shaped first chamber having a first opening for placement of a microwave source, and having a second opening larger than the first opening;
    (b) an insulator positioned across the second opening;
    (c) a second chamber, for holding a source gas, said second chamber being at a pressure suitable for glow discharge, and having a third opening aligned with the second opening, said second chamber positioned on the opposite side of the insulator from the first chamber, said second chamber having a fourth opening opposite the insulator; and
    (d) a partial barrier at said fourth opening, wherein the first chamber contains a metallic reflector having a beveled surface oriented toward the microwave source.

13. The plasma generator assembly of claim 12, wherein the partial barrier comprises a perforated plate.

14. The plasma generator assembly of claim 13, wherein the perforated plate is made of aluminum.

15. The plasma generator assembly of claim 13, wherein the perforated plate has holes which are small enough to contain all of the plasma generated in the second chamber, but through which sufficient radical species pass to allow treatment of the item.

16. The plasma generator assembly of claim 13, wherein the perforated plate has holes which are less than about ¼ inch in diameter.

17. The plasma generator assembly of claim 12, wherein the partial barrier comprises an optical baffle comprising a plurality of optically dense elongated pieces extending across the fourth opening.

18. The plasma generator assembly of claim 12, further comprising a cooling system for the partial barrier.

* * * * *